United States Patent [19]

Sato

[11] Patent Number: 5,756,949

[45] Date of Patent: May 26, 1998

[54] UNIT STRUCTURE FOR HAZARD SWITCH

[75] Inventor: Shunichi Sato, Tokyo, Japan

[73] Assignee: Niles Parts Co.Ltd., Japan

[21] Appl. No.: 597,272

[22] Filed: Feb. 6, 1996

[30] Foreign Application Priority Data

Feb. 13, 1995 [JP] Japan ................... 7-047844

[51] Int. Cl.$^6$ ................................. H01H 35/04
[52] U.S. Cl. ................. 200/61.54; 315/83; 335/202
[58] Field of Search .................. 200/5 R, 4, 16 R,
200/52 R, 61.27, 61.54, 531, 345, 523,
524, 530, 520, 528, 532, 341, 315; 307/9.1,
10.1, 10.8; 315/77, 82, 83; 335/185, 196,
199, 202; 340/76, 81 F, 55, 67, 438, 475

[56] References Cited

U.S. PATENT DOCUMENTS

| | | | |
|---|---|---|---|
| 2,896,190 | 7/1959 | Gallaro et al. | 340/75 |
| 3,944,765 | 3/1976 | Kawai et al. | 200/61.27 |
| 4,028,738 | 6/1977 | Rouvre et al. | 361/403 |
| 4,496,810 | 1/1985 | Suzuki et al. | 200/61.54 |
| 4,739,130 | 4/1988 | Roller et al. | 200/61.27 |
| 5,199,558 | 4/1993 | Neubauer | 200/531 |
| 5,396,106 | 3/1995 | Chretien et al. | 307/10.1 |

FOREIGN PATENT DOCUMENTS

| | | | |
|---|---|---|---|
| 56-70936 | 6/1981 | Japan | H01H 25/07 |
| 1-62625 | 4/1989 | Japan | H01H 13/07 |

Primary Examiner—Michael L. Gellner
Assistant Examiner—Michael A. Friedhofer
Attorney, Agent, or Firm—Ronald P. Kananen

[57] ABSTRACT

A unit structure for a hazard switch used for automobiles. A knob (1) is mounted at a position adjacent to the driver's seat, the knob (1) has a moving block (2) at the rear position of the knob (1). A flasher unit (50) is disposed at the terminal block (B) of the hazard switch (4). The terminal block (B) is composed of a first terminal block (B1) and a second terminal block (B2) mechanically coupled to the first terminal block (B1). Upon an upper surface of the second terminal block (B2), there are mounted electric parts of a discrete type, such as a flasher relay (Ry), a shunt resister (R), electrolytic condensers (C1) and (C2), a jumper wire, and the like. The unit structure of the invention reduces the number of intermediate harnesses, terminals fabrication processes, and parts, and minimizes the size of the hazard switch per se and the current by changing the electric circuit and switch.

2 Claims, 9 Drawing Sheets

UNIT STRUCTURE FOR HAZARD SWITCH

BACKGROUND OF THE INVENTION

1. Field of the Invention

The present invention relates to an operation switch for controlling flash lamps disposed at the front, back, left and right sides of automobiles for flashing the lamps in order to prevent traffic accidents, and more particularly to a unit structure for a hazard switch used for automobiles in which the structure of the operation switch is simplified.

2. Description of the Related Art

Conventional switch devices used to control various components of automobiles, including headlights, cargo lights, hazard lights, interior lights, radio, wipers, and windows. Moreover, several types of switch devices have been used, including rotary switches, slide switches, seesaw switches, push switches, and toggle switches. Push switches have been more frequently used in comparison with other switch devices, because of their operational properties and quick response characteristics.

Japanese Utility Model Publication Laid-Open Nos. 56-70936 and 1-62625 show a push type switch provided with a spring in the central portion of a housing thereof, and a knob that can be automatically restored by the spring. According to the push switch, in the case where the knob of the push switch, which is disposed in the portion near the driver's seat, is pushed by a finger, the push switch is in a closed circuit state, but the push switch becomes automatically in the open state by the resilient force of the spring when the finger is released from the knob.

Moreover, there is a switch lock of the type having the so-called heart-shaped cam, in which when its knob is once pushed, the switch lock is locked, and when the knob is sequentially pushed, the lock state is released. The switch lock has a pin adapted to slidably contact with the guide surface of the heart cam disposed at a rear portion of the knob, and to move together with a slider mounted on the knob. Thus, the pin is made slidable around the heart cam, and therefore the switch lock can perform the ON and OFF switching operation repeatedly by sequential pushing operation of the knob.

Thus, the switch is closed when the pin contacts with the guide surface of the heart cam, and the switch is opened when the pin comes apart from the projected portion of the heart cam. The switch lock of this type has the feature that the formation of the switch may be reduced in thickness, and therefore it becomes possible to install it as a small type switch in a device in which many electric parts are installed. Moreover, the knob of the switch may be automatically restored to its normal position, since the slider mounted at the rear position of the knob is normally activated by the spring.

The hazard switch used in automobiles is disposed at a position near to the driver's seat in order to be able to flash the terminal lamps disposed at the front, rear, left, and right sides of the automobiles for giving caution and preventing traffic accidents. Moreover, the hazard switch adapts the above-mentioned push lock type switch, and is independent from the so-called flasher unit in which other printed wiring substrate and discrete parts are installed, and the hazard switch is connected to the terminals of the parts through an intermediate harness.

In view of the narrow space limitations for mounting, the hazard switch is mounted independently of the flasher unit. A large current flows into the flasher unit. Since the hazard switch is mounted independently from the flasher unit, the intermediate harness disposed in automobiles is increased and results in a complex wiring and mounting. Moreover, output means for a signal lamp is made as a simple circuit.

As mentioned above, the intermediate harness for connecting the hazard switch with the flasher unit has a disadvantage in that it increases the cost of automobiles by increasing the cost of the harness and the number of fabrication processes. Moreover, there are problems with the switch logic of the flasher unit in that it becomes complex and generates a cause of fault. In addition, since the output means to the signal lamp is single, there are problems in that it is difficult to reduce the electric current flows into the flasher unit. Further, a slide switch for directly disconnecting the current becomes bulky.

SUMMARY OF THE INVENTION

In order to solve the above-mentioned problems, the present invention has an object to make the hazard switch as a unit, to reduce the intermediate harness, to reduce the number of terminals and connections, to reduce the number of mounting processes and parts, and to reduce the size of the hazard switch and the current by changing the electric circuit and the switch.

Additional objects, advantages and novel features of the invention will be set forth in part in the description which follows, and in part will become apparent to those skilled in the art upon examination of the following or may be learned by practice of the invention. The objects and advantages of the invention may be realized and attained by means of the instrumentalities and combinations particularly pointed out in the appended claims.

In order to achieve the object of the present invention, there is provided a unit structure for a hazard switch provided with a knob disposed adjacent a driver's seat, characterized in that electric parts composing a flasher unit are directly installed in a terminal block, and the terminal block functions as a print wiring substrate.

The terminal block of the present invention is composed of a first terminal block having a connector and a second terminal block having terminals for inserting into the connector.

The second terminal block of the present invention is loaded with a flasher relay on its upper surface and is further fixed on the back surface of the first terminal block, and the first terminal block is provided with through holes for inserting the flasher relay. The second terminal block of the present invention is provided with electric parts on the back surface thereof and projections are integrally formed therewith, and the back lid has small holes to be fitted to the projections.

The present invention presents a unit structure for a hazard switch composed of a moving block for moving together with a knob, an upper lid for supporting the moving block, and a pole plate, characterized in that the pole plate is provided with terminals molded through an insert molding method and a flasher relay on its upper surface, one end of each of the terminals is projected into a connector and the other end of each of the terminals is projected into the side of the pole plate to make an electrical connection with a circuit substrate composing a flasher unit.

The present invention has a circuit substrate projected downwardly from the pole plate by connecting the circuit substrate with the terminals projected from the side of the pole plate.

BRIEF DESCRIPTION OF THE DRAWINGS

FIGS. 10 to 13 show a second embodiment of the unit structure for the hazard switch of the present invention.

Figure 1:
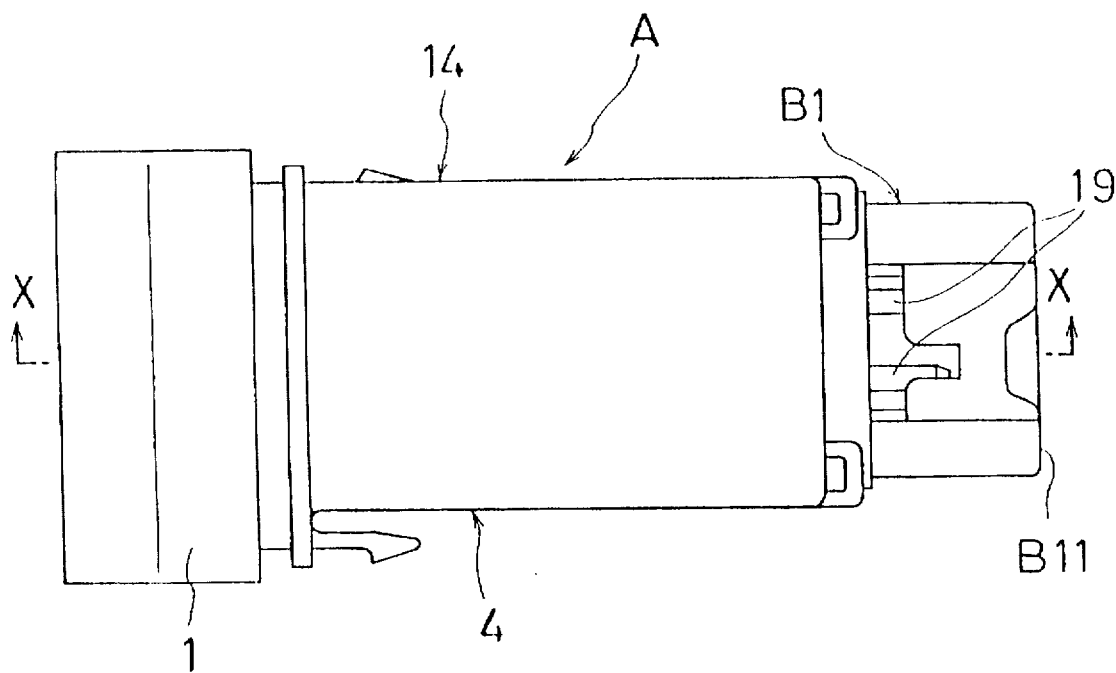
FIGS. 1 to 9 show a first embodiment of the unit structure for the hazard switch of the present invention.
Figure 2:
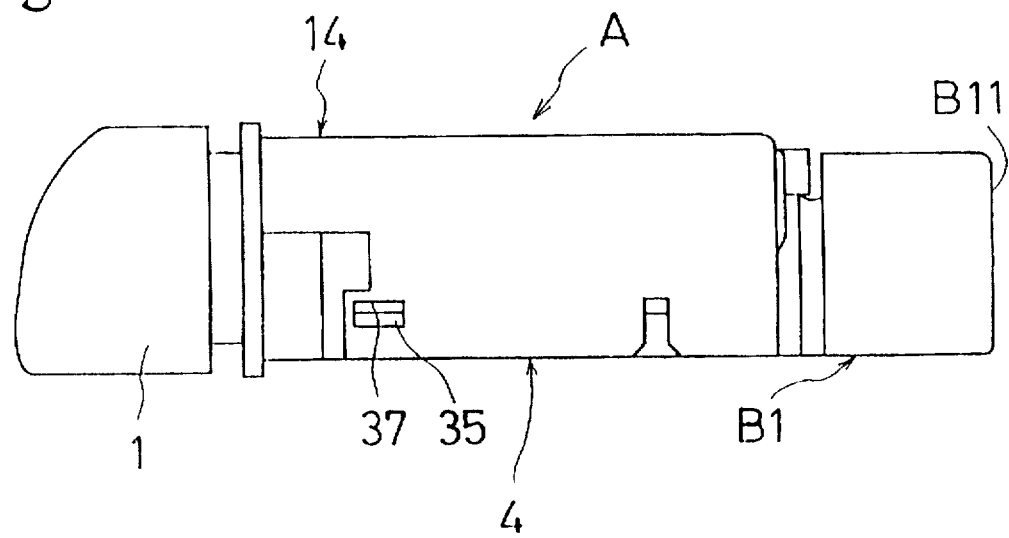
Figure 3:
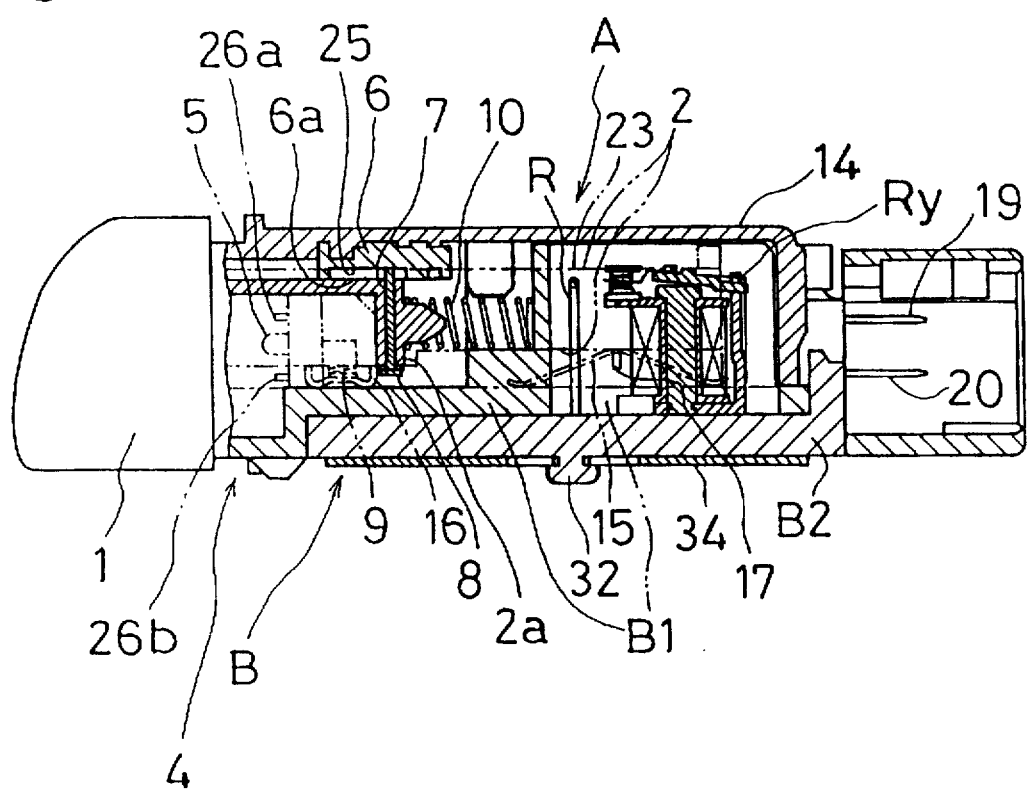
Figure 4:
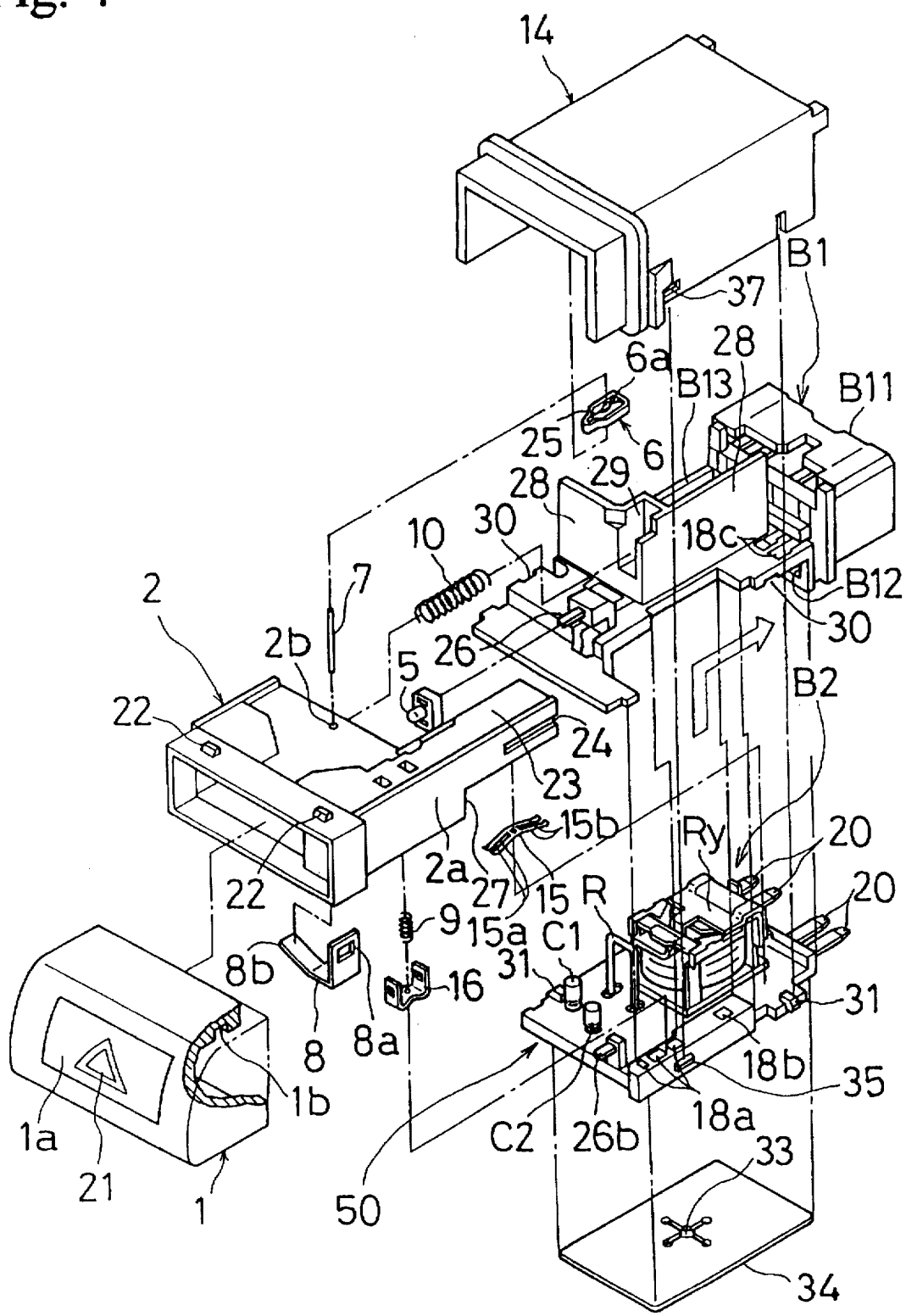
Figure 5:
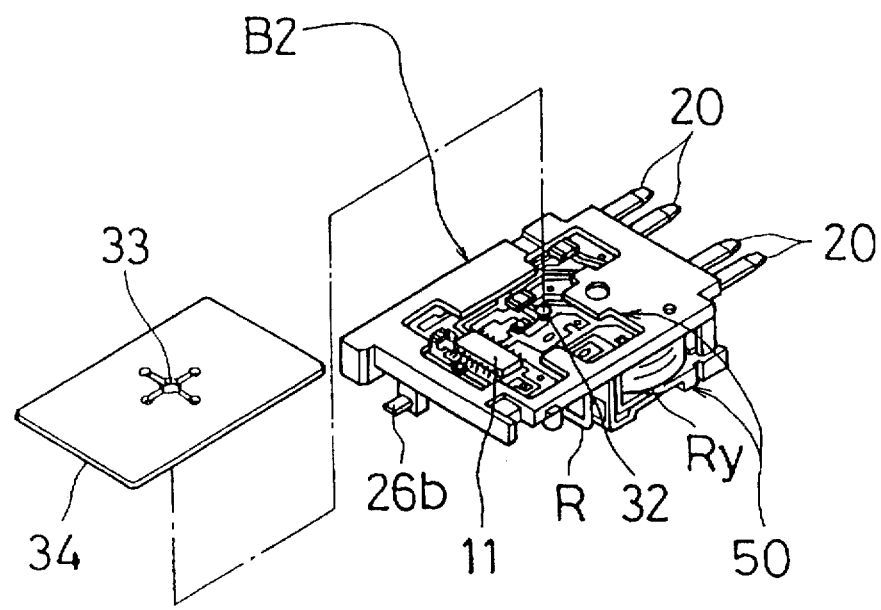
Figure 6:
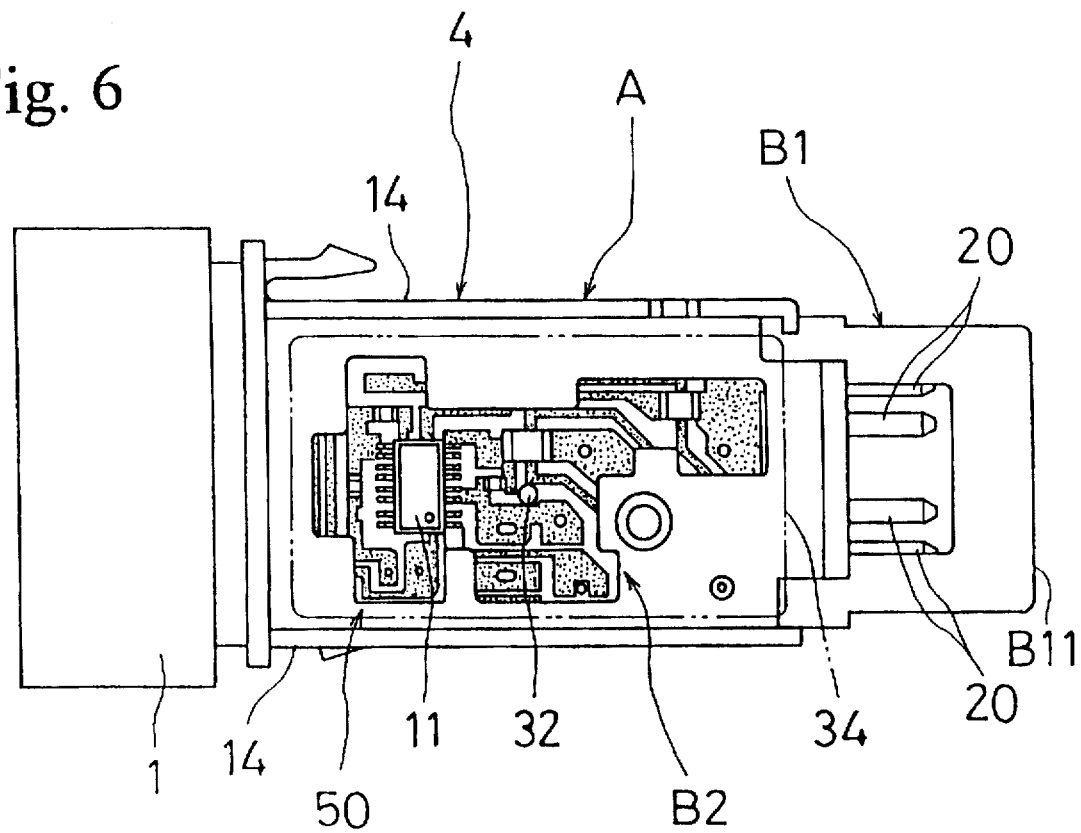
Figure 7:
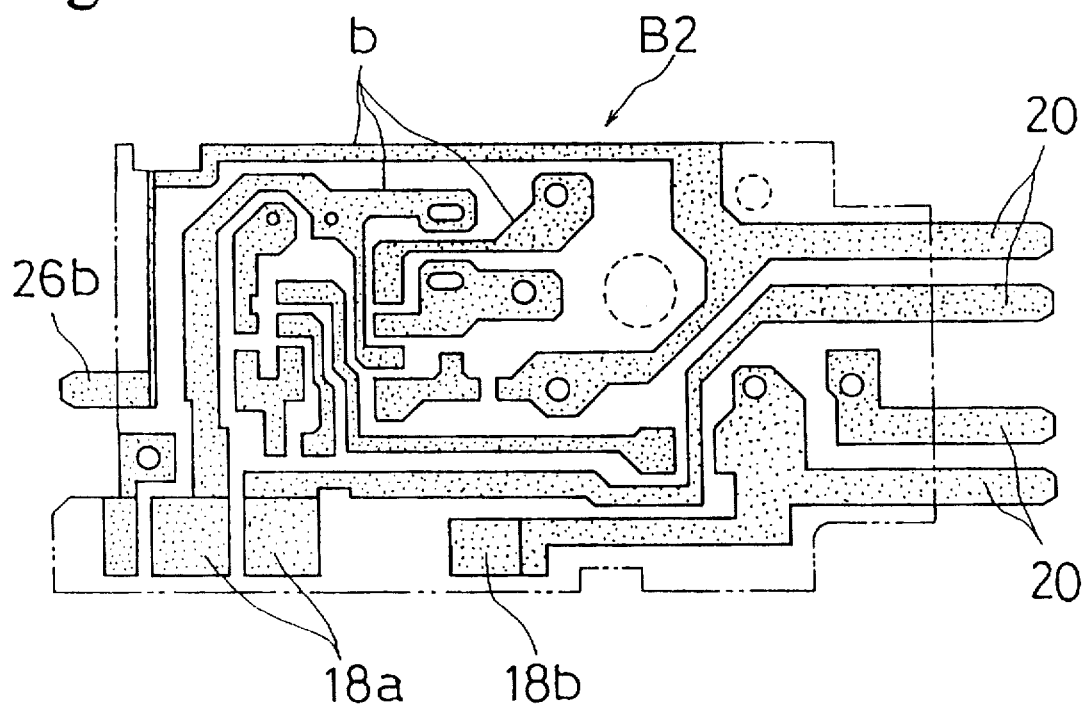
Figure 8:
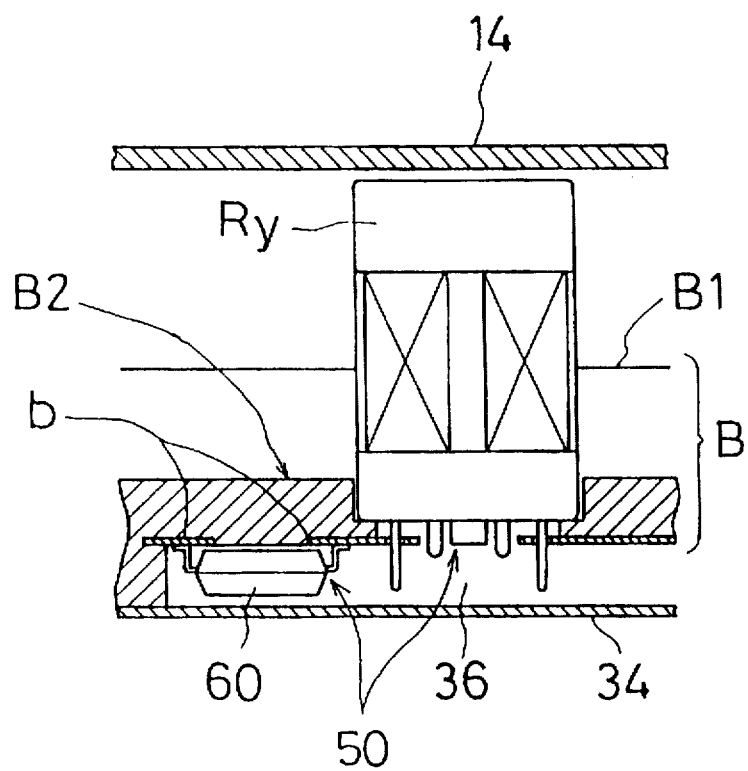
Figure 9:
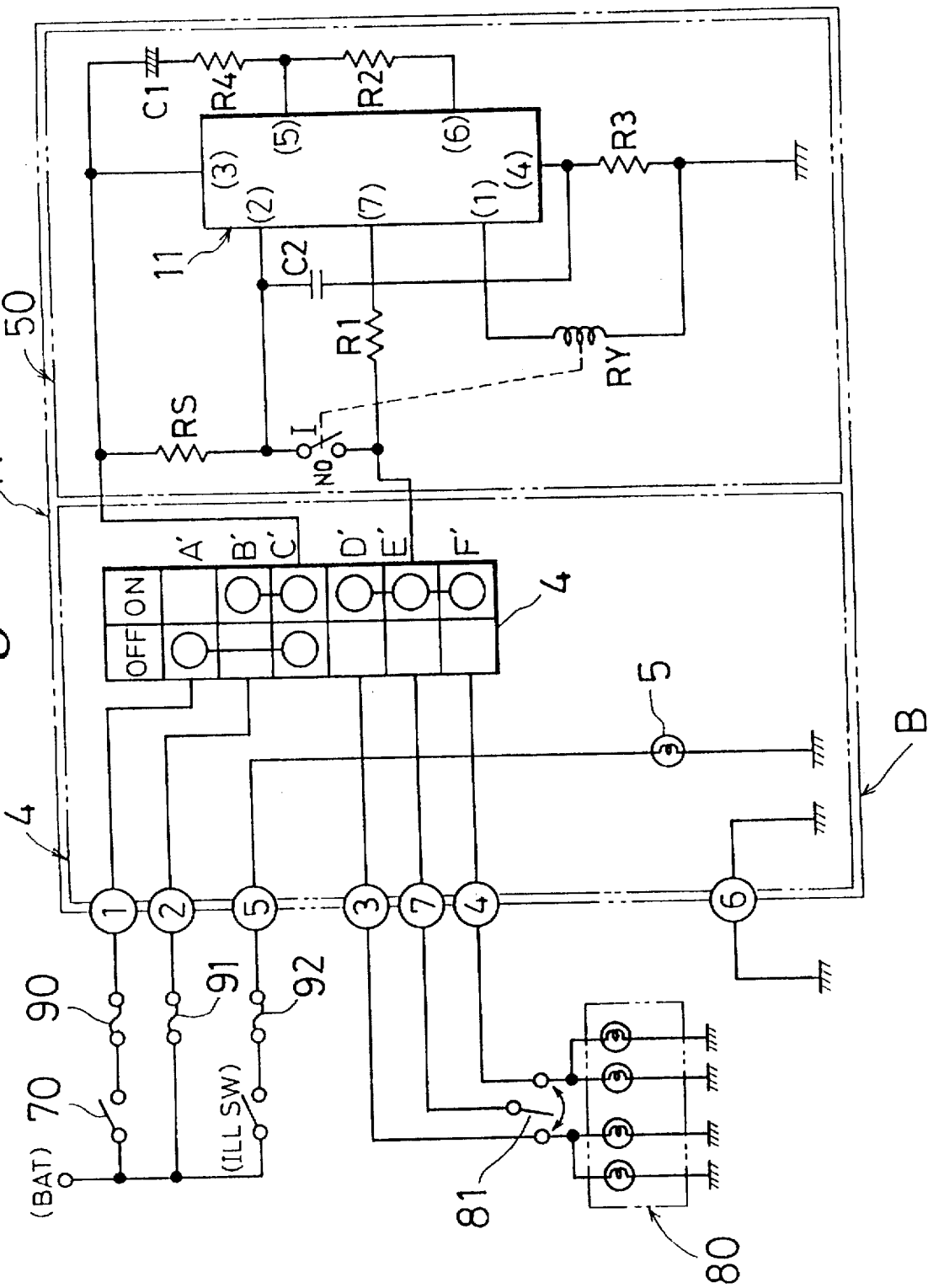
Figure 10:
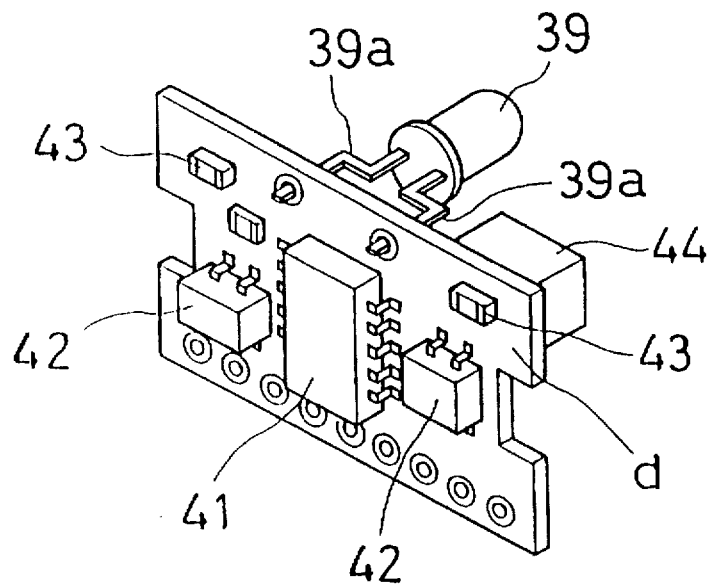
Figure 11:
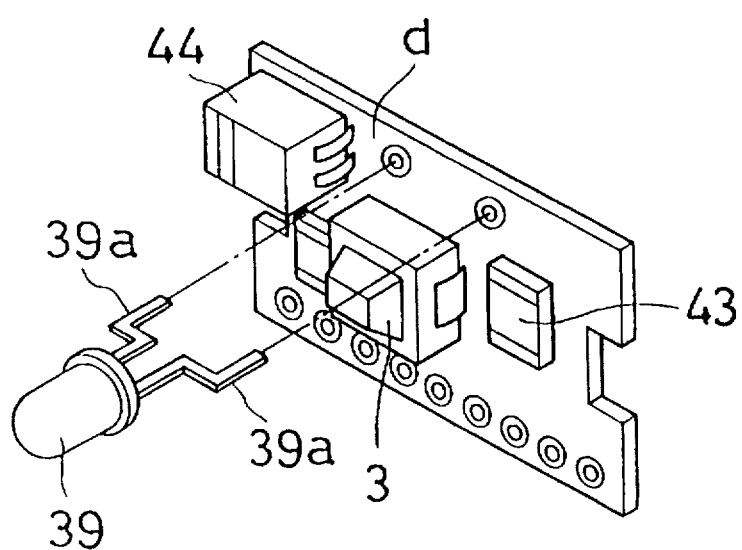
Figure 12:
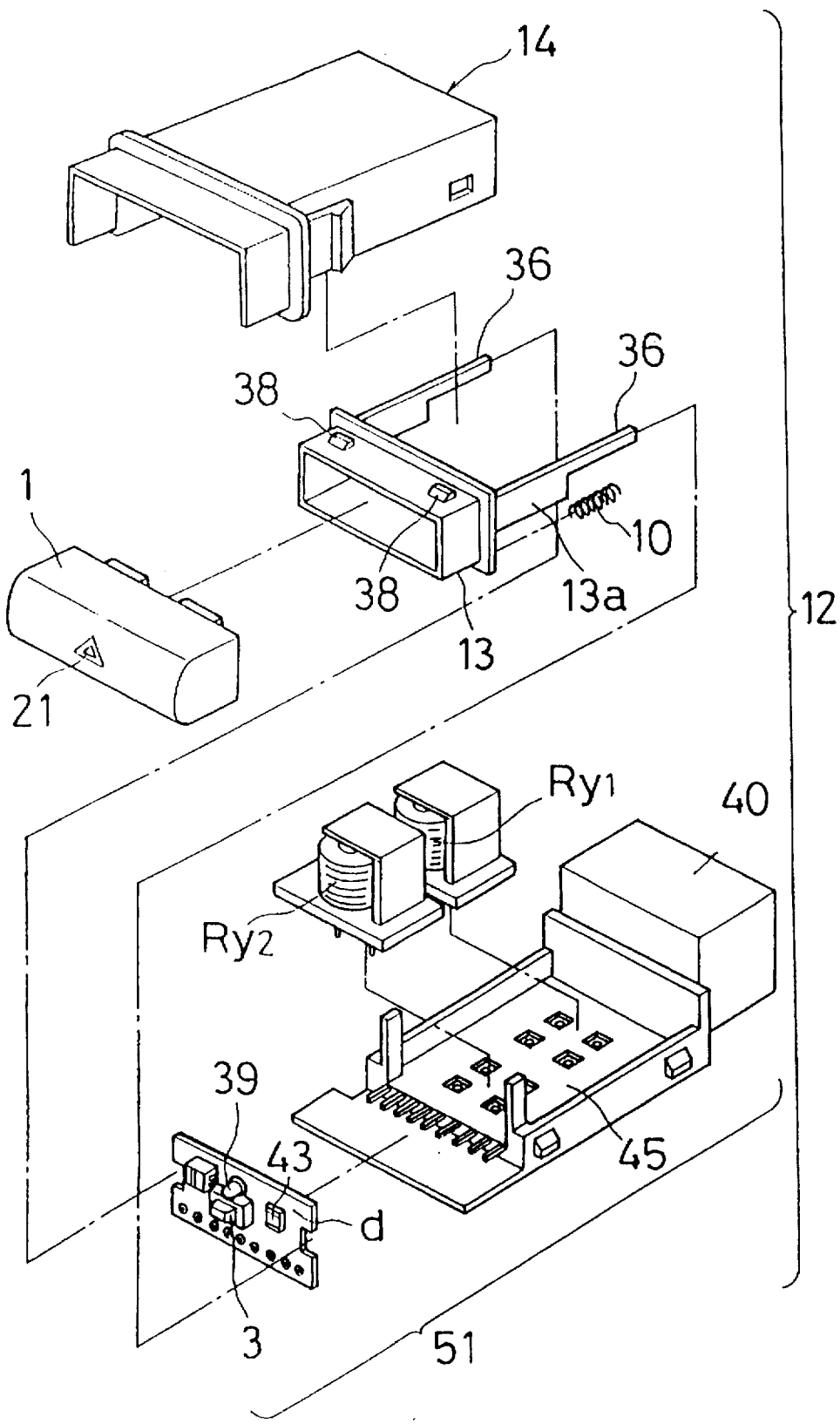

In the drawings:

FIG. 1 is a plan view showing a hazard switch unit of the present invention;

FIG. 2 is a side view of the hazard switch unit in FIG. 1;

FIG. 3 is a sectional view taken along the line X—X in FIG. 1;

FIG. 4 is an exploded view of a hazard switch unit;

FIG. 5 is a perspective bottom plan view of a second terminal block;

FIG. 6 is a bottom plan view of the hazard switch unit when its bottom lid is removed;

FIG. 7 is an enlarged plan view of the terminals of the second terminal block;

FIG. 8 is an enlarged sectional view showing an assembled state of a flasher relay;

FIG. 9 is a wiring circuit of a flasher unit;

FIG. 10 is a perspective rear view showing a circuit substrate of the hazard switch unit of the present invention;

FIG. 11 is a perspective front view of the circuit substrate of the present invention shown in FIG. 10;

FIG. 12 is an exploded view of a switch unit; and

Figure 13:
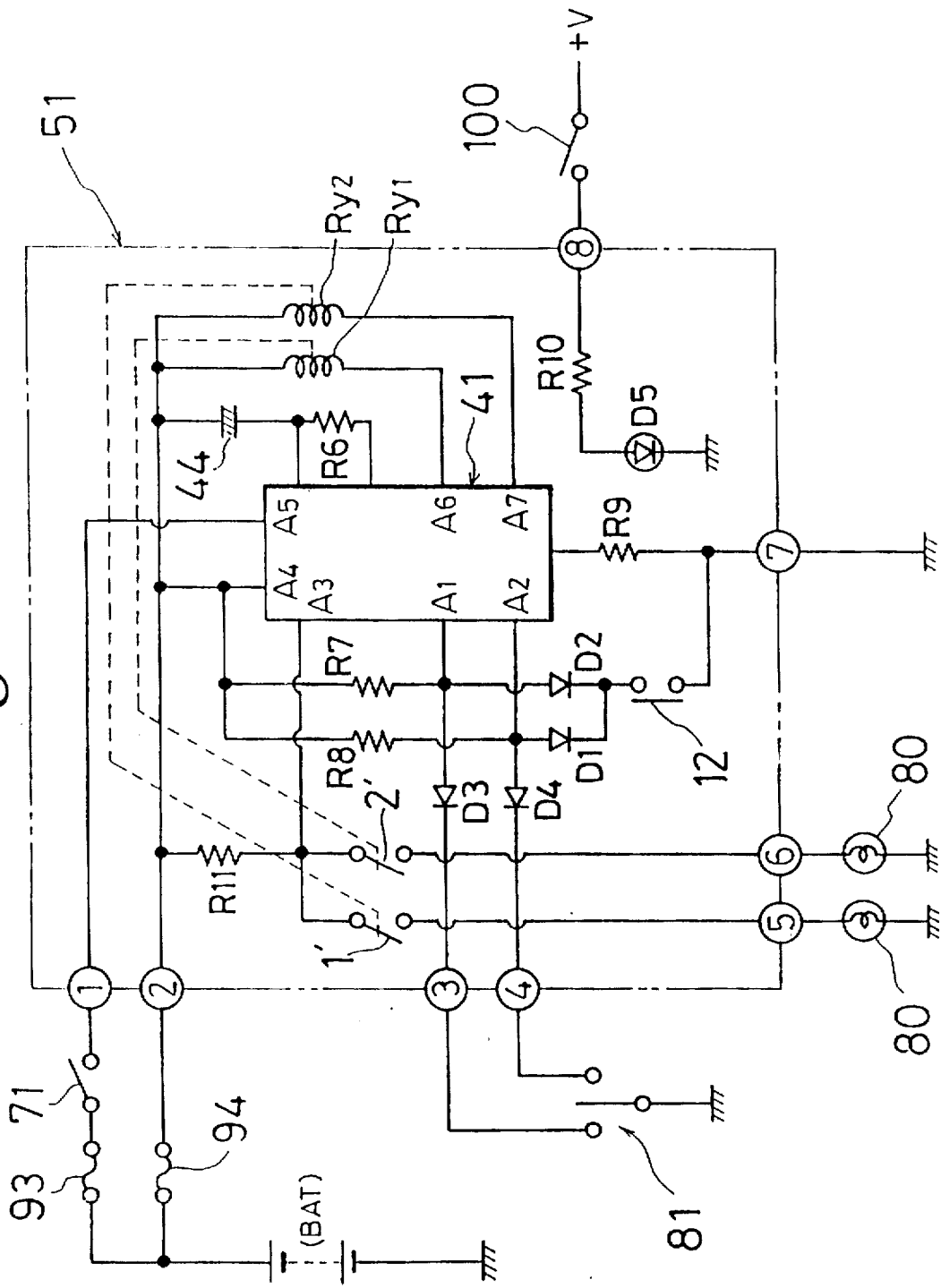

FIG. 13 is a wiring circuit of the electric circuit of a flasher unit.

DETAILED DESCRIPTION OF THE INVENTION

A first embodiment of a unit structure for a hazard switch of the present invention will be described hereinafter with reference to FIGS. 1 to 9.

Referring to FIGS. 1 to 4, a hazard switch unit A will be described. The hazard switch unit A is provided with a knob 1 disposed at the position adjacent to a driver's seat of automobiles and the like, and a moving block 2 at its rear position. The hazard switch unit A has a hazard switch 4 and a flasher unit 50 disposed at a second terminal block B2. The terminal block B is composed of a first terminal block B1 and a second terminal block B2 mechanically coupled to the first terminal block B1. The upper surface of the second terminal block B2 is provided with discrete type electric parts, such as a flasher relay Ry, a shunt resister R, electrolytic condensers C1, C2, and jumper wire.

The lower surface of the second terminal block B2 is provided with an integrated circuit 11 of the flat package type, tip type resisters, and electrolytic condensers C1, C2. A surface mount device 60 may be replaced by a discrete device. Moreover, the terminal block B functions as a print wiring substrate. The hazard switch 4 is formed integrally with the flasher unit 50.

Respective main portions in the unit structure for the hazard switch unit A will be described hereinafter with reference to figures showing the respective main portions. In FIG. 3, which shows the internal parts installed within the hazard switch unit A, numeral 1 denotes a knob that is movable by being pushed. The knob 1 is disposed at the driver's seat side and has a heart cam 6.

Numeral 5 denotes a light emitting diode or an electric lamp used for illuminating the knob 1 from its inside, thereby being able to observe the position of the knob 1 even at night or in a dark environment, such as in a tunnel. The heart cam 6 has a recess surface 25. A pin 7 is inserted into a hole 2b mounted on a moving piece 2a along with the recess surface 25. The pin 7 is adapted to be movable by means of a plate spring 8 supporting the pin 7 in the vertical direction. The pin 7 can be slidable together with the moving piece 2a to contact the projected portion 6a of the heart cam 6.

The pin 7 is adapted to be thus movable in the vertical direction by being inserted into the hole 2b of the moving piece 2a and supported by the plate spring 8. Therefore, when the moving piece 2a moves in the longitudinal direction of the case 14 by being pushed by the knob 1, the heart cam 6 moves along with the recess surface 25 of the heart cam 6. When the pin 7 contacts with the projected portion 6a of the heart cam 6, the pushed knob 1 is maintained in the ON state. When the knob 1 is again pushed by an operator, the pin 7 is removed from the projected portion 6a of the heart cam 6, and circulated along with the periphery of the projected portion 6a of the heart cam 6 thereby automatically returning to the OFF state by being pushed by a spring 10.

As mentioned above, the knob 1 can be restored to the original position thereof, namely to the position before being pushed, by the resilient force of the spring 10 for urging the moving piece 2a mounted on the position near to the knob 1. The plate spring 8 can be fixed by securing the fixing piece 8a of the plate spring 8 on the portion (not shown) formed on an inner-upper surface of the moving block 2. The spring portion 8b of the plate spring 8 urges the pin 7 resiliently.

Numeral 9 denotes a small coil spring for urging a movable member 16 into contact with the contacts 18a. An upper lid 14 covers the second terminal block B2 through the first terminal block B1. The second terminal block B2 is fixed on the lower surface of the first terminal block B1 by inserting external connector terminals 20 into the through hole B12 of the connector B11 of the first terminal block B1.

Numeral 15 denotes a plate-shaped slider formed in a mountain-shaped fold. A central portion of the slider 15 is fixed to the moving piece 2a by using a fixing pin 17 mounted on the bottom surface of the moving piece 2a. When the second terminal block B2 is coupled to the first terminal block B1, the surface of the second terminal block B2 mounted with the fixed contacts 18a and 18b is positioned in the same plane with the surface of the first terminal block B1 mounted with the fixed contacts 18c.

Since the knob 1 is coupled with the moving piece 2a by utilizing a snap-action, there is provided such relationship in position that when the knob 1 is pushed and the slider 15 is advanced, the fixed contacts 18b mounted on the second terminal block B2 and the fixed contacts 18c mounted on the first terminal block B1 can contact the slider 15. By moving the slider 15, the contact 15a contacts with the fixed contact 18b, and on the other hand the contact 15b contacts with the fixed contact 18c. Moreover, numerals 19 and 20 denote external connector terminals. The external terminals 19 have the first terminal block B1 and the switch contact 18c. The external terminals 20 have the second terminal block B2 and the fixed contacts 18a and 18b serve as switch contacts.

FIG. 4 is an exploded perspective view of the hazard switch unit A of the present invention. The knob 1 is designed with a semi-transparent plastic sheet 1a printed with a triangle indication mark 21. If the knob 1 is pressed at night or in a dark place, such as in a tunnel, a lamp 5 disposed in its interior is immediately lighted. The lighted interior of the knob 1 enables the indication mark 21 to be observed through the semi-transparent plastic sheet 1a.

The moving piece 2a is provided with an opening at its front portion and projections 22 at the outer and front portion. The projections 22 are adapted to be fitted to the recess portions 1b formed on the inner surface of the knob 1, respectively, thereby coupling the moving block 2 with the knob. The moving piece 2a has a projected portion 23 formed with a guide portion 24 at the rear side thereof in order to guide the movement of the moving piece 2a. The pin 7 mounted at the central portion on the upper surface of the moving piece 2a is disposed so that the pin 7 may be contacted with the heart cam 6.

The first terminal block B1 and the second terminal block B2 are provided with the terminals 26a and 26b to be connected to the terminals of the lamp 5 for illuminating the knob 1. Moreover, the first terminal block B1 is provided with a notch portion 27 for receiving the slider 15, and a recess portion 29 mounted on the compartment wall 28 in the longitudinal direction of the first terminal block B1. The spring 10 for urging the rear surface of the moving piece 2a is received in the recess portion 29. At the inner side of the compartment wall 28, there is provided a through hole B13 for receiving the flasher relay Ry.

The first terminal block B1 is provided with several fitting portions 30 at the bottom wall surface thereof. The second terminal block B2 mounted with the flasher unit 50 is provided with several fitting members 31 to be fitted to the fitting portions 30, respectively. Claws 35 mounted on the flasher unit 50 are fitted to the holes 37 mounted on the upper lid 14 thereby coupling the flasher unit 50 to the hazard switch 4 integrally.

The second terminal block B2 is loaded with the electric parts, such as the flasher relay Ry, electrolytic condensers C1, C2, shunt resisters R and the like, as mentioned above. Moreover, the second terminal block B2 is provided with plural external terminals 20 at the rear portion thereof.

FIG. 5 is a perspective bottom plan view of the second terminal block B2. At the rear side of the second terminal block B2, there is mounted the integrated circuit 11 and other electric circuit and a projection 32 at the central portion thereof. The projection 32 has an enlarged portion at the end point of the projection 32, which is adapted to be inserted into a small hole 33 mounted at the central portion of the bottom lid 34 thereby fixing the bottom lid 34 to the second terminal block B2. Furthermore, the second terminal block B2 is covered with the upper lid 14 formed as the structure as seen in FIG. 4, by utilizing a snapping operation.

FIG. 7 is an enlarged plan view of the terminals b in the second terminal block B2, and the terminals b formed with the external terminals 20. FIG. 8 is an enlarged sectional view showing a partly broken main portion of the second terminal block B2. The connecting portion of the electric parts will be described in detail hereinafter. Numeral 14 denotes the upper lid, and mark Ry denotes the flasher relay. The second terminal block B2 is loaded with a switch contact portion at its upper surface, and the surface mount device 60 at its lower surface.

FIG. 9 is a view for explaining the electric wiring circuit of the flasher unit 50. The flasher unit 50 has seven external connecting terminals 1' to 7' (connector portions) and the hazard switch 4 has six switch contacts A'–F'. The connecting portion 1' is connected to an ignition switch 70 connected to an electric power source (BAT) through a fuse 90, and further connected to the switch contact A' of the hazard switch 4. Moreover, the connecting portion 2' is connected to the electric power source (BAT) through a fuse 91, and further directly connected to the switch contact B' of the hazard switch 4.

The connecting portion 5' is connected to the electric power source (BAT) through an illumination switch (ILL SW) and a fuse 92, and further connected to the one terminal of the illumination lamp 5. The other terminal of the illumination lamp 5 is grounded. The connecting portion 3' is connected to one terminal of the turn signal lamps 80 mounted on the right side (R). The other terminal of the turn signal lamps 80 is connected with the ground, and further connected to the switch contact D' of the hazard switch 4. Similarly, the connecting portion 4' is connected to one terminal of the turn signal lamps 80 mounted on the left side (L), and the other terminal of the turn signal lamps 80 is connected with the ground, and further connected to the switch contact F' of the hazard switch 4.

The connecting portion 7' is connected to one terminal of the turn signal switch 81 for switching the turn signal lamps 80 for the left side (L) and the turn signal lamps 80 for the right side (R). The connecting portion 7' is further connected to the switch contact E' of the hazard switch 4. Both ends of the connecting portion 6' are connected to the ground without any connection to other parts.

The hazard switch 4 is connected to the terminal (5) of the integrated circuit 11 through the electrolytic condenser C1 and the resister R4, from the switch contact C' side, and further to the terminal (6) of the integrated circuit 11 through the resister R2. The terminal (3) of the integrated circuit 11 is connected to the joint between a detection resister RS and the electrolytic condenser C1. Furthermore, the hazard switch 4 is connected to the terminal (7) of the integrated circuit 11 through the resister R1 from the switch contact E' side.

The detection resister RS and the contact I of the flasher relay Ry are connected in series between the terminals (7) and (3) of the integrated circuit 11. The joint between the detection resister RS and the contact I of the flasher relay Ry is connected to the terminals (2) of the integrated circuit 11. The electrolytic condenser C2 is connected between the terminals (2) and (4) of the integrated circuit 11. The terminal (4) of the integrated circuit 11 is grounded through the resister R3. The flasher relay Ry is connected between the ground and the terminal (1) of the integrated circuit 11.

The operation of the electric circuit will be described hereinafter. At an ON state of the hazard switch 4, the terminal (7) of the integrated circuit 11 becomes low potential (Lo). Namely, the potential at the terminal (1) of the integrated circuit 11 becomes high level (Hi) upon Lo. Therefore, the states of Hi and Lo are repeated.

When the terminal (1) of the integrated circuit 11 is high level, the contact I of the flasher relay Ry becomes ON state. Furthermore, the turn signal lamps 80 for the right side (R) and the turn signal lamps 80 for the left side (L) are supplied with electric power source (BAT), and the current from the electric power source (BAT) flows from the electric power source (BAT) to the fuse 91→the connection portion 2'→the switch contact B'→the switch contact C'→the detection switch RS→the contact I →the switch contact E'→the switch contact D'→the switch contact F'→the connection portion 3'→and finally, the connection portion 4'.

When the turn signal switch 81 is in ON state, the terminal (7) of the integrated circuit 11 becomes low potential (Lo), and therefore when the terminal (1) of the integrated circuit 11 is in the high level (Hi), the contact I of the flasher relay Ry becomes in ON state. Furthermore, the turn signal lamps 80 for the right side (R) and the turn signal lamps 80 for the left side (L) are supplied with electric power source (BAT), and the current from the electric power source (BAT) flows into the ignition switch 70→the fuse 90→the connection portion switch (1)→the switch contact A'→the switch contact C'→the detection resister RS→the switch contact E'→the switch contact D'→the switch contact F'→the connection portion 3'→and finally, the connection portion 4'.

Referring now to FIGS. 10 to 13, another embodiment of the unit structure for the hazard switch of the present invention will be described. FIGS. 10 to 13 show a second embodiment of the unit structure for a hazard switch according to the present invention wherein: FIG. 10 is a perspective back view of the circuit substrate d of the hazard switch unit A mounted with the electric circuits; FIG. 11 is a perspective front view of FIG. 10; FIG. 12 is an exploded perspective view showing the hazard switch unit; and FIG. 13 is a view for explaining an electric circuit of the flasher unit 51. The plan view and side view of the hazard switch unit A in the second embodiment are generally the same as that in FIGS. 1 and 2 of the first embodiment of the present invention.

In the unit structure for the hazard switch, the output means of the turn signal lamps 80 mounted on the right side (R) is independent from the output means of the turn signal lamps 80 mounted on left side (L). Namely, it is possible to simplify a switching logic and minimize a current by providing two relay contacts. Therefore, the heart cam switch of a so-called push lock type provided with a heart cam 6 is adopted to minimize the unit structure.

A tact switch 3 allowing the flow of a small current is mounted on the circuit substrate d in the hazard switch 12. The hazard switch 12 includes the flasher unit 51 composed of the electric parts mounted on the circuit substrate d and the pole plate 45, within the upper lid 14. If the knob 1 is pushed, the moving piece 13a in the moving block 13 pushes the tact switch 3, thereby switching the hazard switch unit A to an open state.

In more detail, the pole plate 45 is directly provided with two flasher relays Ry1, Ry2, and the pole plate 45 and the circuit substrate d provide the electric circuits required for the flasher unit 51. Moreover, the tact switch 3 is welded on the circuit substrate d. Therefore, if the knob 1 is merely pressed, the moving piece 13a pushes the tact switch 3 thereby switching the hazard switch 12 from OFF to ON.

FIGS. 10 and 11 are perspective views showing the circuit substrate d of the hazard switch unit A mounted with the electric circuits, and the tact switch 3 is of the surface mounted device type. Numeral 39 denotes a lamp such as a light emitting diode for illuminating the inside of the knob 1 at night, and the terminals 39a of the lamp 39 are connected to the circuit substrate d. The integrated circuit 41, the other diodes 42, the tip resisters 43, and an electrolytic condenser 44 and the like are mounted on both surfaces of the circuit substrate d.

FIG. 12 is an exploded perspective view of the hazard switch unit A, in which numeral 14 denotes an upper lid formed with the shape as shown in FIG. 12. The upper lid 14 covers the pole plate 45 through the moving piece 13a. The moving piece 13a has a rectangular opening at the front portion thereof, and a pair of projecting rods 36 at the rear portion thereof. The moving piece 13a has a pair of fitting members 38 at the front and upper surface of the moving piece 13a, and therefore the knob 1 can be coupled with the moving piece 13a by fitting the fitting members 38 to the recess portions (not shown) formed at the inner wall of the knob 1, respectively, thereby fixing the members 38 in a snap operation.

The pole plate 45 is provided with two flasher relays Ry1, Ry2. The terminals of the flasher relays Ry1, Ry2 are welded to the pole plate 45. The circuit substrate d having the tact switch 3 is welded to the pole plate 45. Moreover, numeral 40 denotes a connector. FIG. 13 is a circuit diagram of the electric circuit of the flasher unit 51 in order to explain the electric circuit of the flasher unit 51 in detail. The flasher unit 51 has a plurality of connecting terminals 1" to 8" (connecting portions).

The electric power source (BAT), which has one end grounded, is connected to the connecting portion 1" of the flasher unit 51 through the fuse 93 and the ignition switch 71, and the connecting portion 1" is connected to the terminal A5 of the integrated circuit 41. The connecting portion 2" is connected to the electric power source (BAT) through the fuse 94, and is connected to the terminal A4 of the integrated circuit 41, and to the integrated circuit 41 through the electrolytic condenser 44 and the resister R6. The jointed point between the electrolytic condenser 44 and the resister R6 is connected to the integrated circuit 41.

Furthermore, the connecting portion 2" is connected to the terminal A6 of the integrated circuit 41 through the flasher relay Ry1, and further connected to the terminal A7 of the integrated circuit 41 through the other flasher relay Ry2. By this, the normally open contacts 1S and 2S are switched thereby flashing the turn signal lamp 80 of the right side and the left side. Therefore, the turn signal lamp 80 for the right side (R), one end of which is grounded, is connected to the connecting portion 5" and to the terminal A3 of the integrated circuit 41 through the normally open contact 1S.

The one end of the turn signal lamp 80 at the left side (L) is grounded, and the other end thereof is connected to the connecting portion 6". The connecting portion 6' is connected to the connecting portion 2" through the normally open contact 2S and the resister R11. The series of the resister R8 and the diode D1 is connected between the terminal A4 of the integrated circuit 41 and one end of the hazard switch 12, and similarly the series of the resister R7 and the diode D2 is connected between the terminal A4 and one end of the hazard switch 12. Another end of the hazard switch 12 is connected to the connecting portion 7" one end of which is grounded and the other end of which is connected to the integrated circuit 41 through the resister R9.

The other end of the hazard switch 12 is connected between the resister R9 and the connecting portion 7". The connecting portion 3" of the flasher unit 51 is connected to one of the contacts of the turn signal switch 81, and connected to the terminal A1 of the integrated circuit 41 through the diode D3. The other contact of the turn signal switch 81 is connected to the connecting portion 4", and connected to the terminal A2 of the integrated circuit 41 through a diode D4. The light switch 100 is connected to the connecting portion 8" of the integrated circuit 41, and the connecting portion 8" is grounded through the resister R10 and the light emitting diode D5.

Referring now to the operation of the electric circuit, when the hazard switch 12 is in the ON state, the outputs of the terminals A1 and A2 of the integrated circuit 41 become low level (Lo), and the output at the terminals A6 and A7 becomes high level (Hi) and low level (Lo) repeatedly. Furthermore, when the output of the terminals A6 and A7 of the integrated circuit 41 is Hi, the contacts 1S and 2S of the flasher relays Ry1 and Ry2 is in the ON state. Therefore, the current flowing from the electric power source (BAT) into the turn signal lamp 80 is as follows: the electric power source (BAT)→fuse 94→the connection portion 2"→the resister R11 →the contact 1S and the contact 2S →and finally, the contact portions 5" and 6".

When the turn signal switch 81 is ON, the terminal A1 of the integrated circuit 41 becomes Lo, and the output of the terminal A6 of the integrated circuit 41 becomes Hi and Lo repeatedly. When the output of the terminal A2 of the integrated circuit 41 becomes Lo, the terminal A7 of the integrated circuit 41 becomes Hi and Lo repeatedly. When the output of the terminal A6 of the integrated circuit 41 becomes Lo, the contact 1S of the flasher relay Ry2 becomes ON state, the terminal A7 of the integrated circuit 41 becomes Lo, and the contact 2S of the flasher relay Ry1 becomes ON state. Therefore, the current flows from the electric power source (BAT) into the turn signal lamp 80 as follows: the electric power source (BAT)→fuse 94→the connection portion 2"→the resister R11→the contact 1S or the contact 2S→the contact portion 5" or the contact portion 6". If the ignition switch 71 is OFF, no output is applied to the turn signal lamp 80. Therefore, the output of the terminal A5 of the integrated circuit 41 monitors the ignition switch 70.

As mentioned above, according to the present invention, the flasher unit can be installed integrally with the hazard switch per se, the terminal block of the hazard switch is directly mounted with the electric parts of the flasher unit, and the terminal block functions as a print wiring substrate. Therefore, it is possible to minimize the size of the hazard switch unit, to reduce the current by the circuit modification due to relay contacts and usage of the heart cam switch and the like, to reduce the number of harness, connectors terminals, and fabricating processes, to increase an effective utilization of space, to make a switch logic simple, to remove a sliding switch, to adopt a tact switch, to achieve a simple pushing operation, and to increase operation ability, thereby reducing the cost of automobiles and parts, and increasing utilization merit.

The foregoing description of a preferred embodiment of the invention has been presented for purposes of illustration and description. It is not intended to be exhaustive or to limit the invention to the precise form disclosed, and obviously many modifications and variations are possible in light of the above teaching. It is intended that the scope of the invention be defined by the claims appended hereto.

What is claimed is:

1. A unit structure for mounting a core of an electromagnetic relay, comprising:

a flasher unit composed of electric parts that are directly installed in a terminal block, said terminal block functioning as a print wiring substrate;

wherein said terminal block is composed of a first terminal block with a connector and a second terminal block with terminals to be inserted into said connector; and further comprising a flasher relay mounted on an upper surface of said second terminal block and fixed on a back surface of said first terminal block, said first terminal block being provided with a through hole to be passed through by said flasher relay.

2. The structure for mounting the core of an electromagnetic relay according to claim 1, wherein said electric parts are mounted on a back surface of said second terminal block, said second terminal block being formed with a projection integrally, and a bottom lid with a small hole to be coupled with said projection.

* * * * *